United States Patent [19]
Endo

[11] Patent Number: 6,121,162
[45] Date of Patent: Sep. 19, 2000

[54] METHOD OF FORMING A FLUORINE-ADDED INSULATING FILM

[75] Inventor: Kazuhiko Endo, Tokyo, Japan

[73] Assignee: NEC Corporation, Tokyo, Japan

[21] Appl. No.: 09/085,783

[22] Filed: May 28, 1998

[30] Foreign Application Priority Data

Jun. 3, 1997 [JP] Japan ................................. 9-144878

[51] Int. Cl.$^7$ ................................................ H01L 21/31
[52] U.S. Cl. ...................... 438/787; 438/238; 438/767; 437/238
[58] Field of Search ................................ 438/787, 238, 438/763; 437/238

[56] References Cited

U.S. PATENT DOCUMENTS

| | | | |
|---|---|---|---|
| 5,156,919 | 10/1992 | Brar et al. | |
| 5,215,787 | 6/1993 | Homma | 427/248.1 |
| 5,288,518 | 2/1994 | Homma | 427/255.1 |
| 5,429,995 | 7/1995 | Nishiyama et al. | 437/238 |
| 5,800,877 | 9/1998 | Maeda et al. | 427/535 |

FOREIGN PATENT DOCUMENTS

| | | |
|---|---|---|
| 0 284 693 A2 | 10/1988 | European Pat. Off. |
| 0 531 029 A2 | 3/1993 | European Pat. Off. |
| 0 680 036 A1 | 11/1995 | European Pat. Off. |
| 0 701 283 A2 | 3/1996 | European Pat. Off. |
| 0 730 298 A2 | 9/1996 | European Pat. Off. |
| 08083842 | 3/1996 | Japan. |
| 8-88223 | 4/1996 | Japan. |
| 8-97199 | 4/1996 | Japan. |
| 8-222557 | 8/1996 | Japan. |
| 10-79384 | 3/1998 | Japan. |
| 10-163192 | 6/1998 | Japan. |
| 2 174 877 | 11/1986 | United Kingdom. |

OTHER PUBLICATIONS

L.D.B. Kiss, et al., "CF and CF2 Actinometry in a CF4/Ar Plasma", *J. Appl. Phys.* 71, (7), Apr. 1, 1992.

H. Miyajima, et al., "Formation Mechanism of F–Added SiO2 Films using Plasma CVD", 1994 Dry Process Symposium.

K. Endo, et al. "Fluorinated Amorphous Carbon Thin Films Grown by Plasma Enhanced Chemical Vapor Deposition for Low Dielectric Constant Interlayer Dielectrics", *J. Appl. Phys.* 78, (2), Jul. 15, 1995.

*Primary Examiner*—David Nelms
*Assistant Examiner*—Pho Luu
*Attorney, Agent, or Firm*—Hutchins, Wheeler & Dittmar

[57] ABSTRACT

There is provided a method of forming an insulating film containing fluorine therein, including the steps of dissociating a process gas containing no hydrogen molecules and atoms with plasma in a reduced pressure, and varying said pressure while said insulating film is being formed, for controlling a content of fluorine in said insulating film. For instance, the pressure is first set low, then raised, and then lowered in the second step. The insulating film containing fluorine therein may be an amorphous carbon fluoride film or a silicon dioxide film containing fluorine therein. In accordance with the above-mentioned method, it is possible to form a fluorine-added insulating film in which hydrofluoric acid, a product causing many problems, is not generated, by using material containing no hydride. In addition, a control for a content of fluorine in an insulating film, which was difficult because the insulating film contains no hydride, can be carried out by varying a pressure while the insulating film is being formed.

17 Claims, 6 Drawing Sheets

F I G. 2
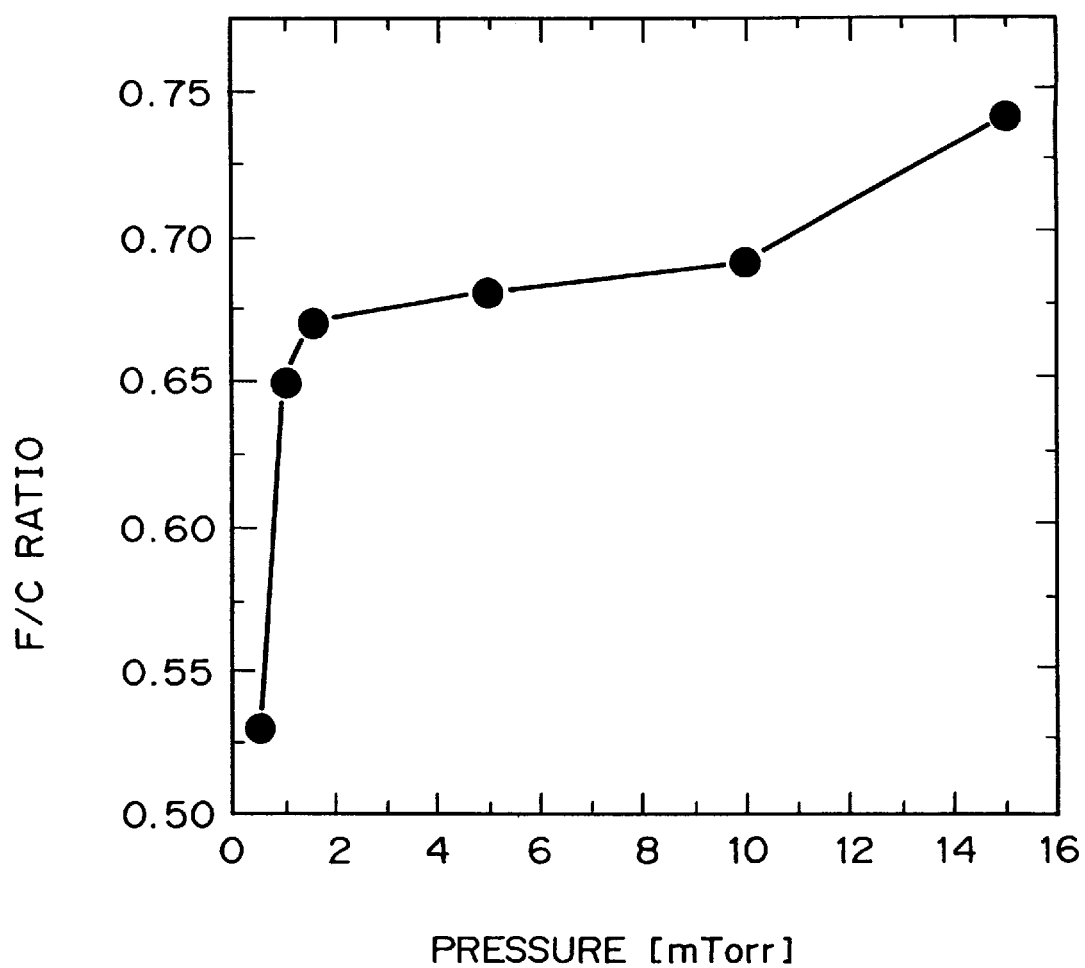

METHOD OF FORMING A FLUORINE-ADDED INSULATING FILM

BACKGROUND OF THE INVENTION

1. Field of the Invention

The invention relates to a method of forming a thin insulating film containing fluorine (F) therein, and more particularly to a method of forming a fluorine-added insulating film having a low dielectric constant for electrically insulating wiring layers from each other in a semiconductor device having multiple wiring layers.

2. Description of the Related Art

With an increase in integration of LSI, it is quite important to form a multi-layer wiring structure with high reliability in fabrication of LSI. In a present multi-layer wiring structure, insulating films are sandwiched between wiring layers in order to avoid intersection and overlap of wiring layers. Such an interlayer insulating film is generally composed of material having a heat resistance and an electric insulation, such as silicon dioxide, silicon nitride and boronphosphosilicate glass. In addition, an interlayer insulating film is formed between wiring layers by chemical vapor deposition (CVD) for planarizing irregularities in wiring layers therewith.

However, with a design rule for LSI being smaller, there has been paused a problem of wiring delay caused by parasitic capacity between wiring layers, which problem is more serious than a problem of signal delay caused by individual devices such as a transistor constituting LSI. In other words, even if a device such as a transistor is fabricated in a smaller size for enhancing an operation speed thereof, an operation speed of LSI is not improved because of wiring delay. Under those circumstance, it is in urgent need to newly develop an interlayer insulating film having a smaller dielectric constant $\epsilon r$ than that of a silicon nitride film, which has a dielectric constant $\epsilon r$ equal to 7 or smaller, and a silicon dioxide film, which has a dielectric constant $\epsilon r$ equal to 3.9 or smaller, both of which are presently widely used as an insulating film in fabrication of LSI.

As a material having a low dielectric constant, there are widely used an insulating material composed mainly of silicon and an insulating material composed mainly of polymer. They have both merits and demerits. Namely, an insulating material composed mainly of silicon has an advantage that the existing LSI techniques can be applied thereto, but it is quite difficult to adequately lower a dielectric constant thereof. An insulating material composed mainly of polymer has an advantage that it is relatively easy to lower a dielectric constant thereof, but it does not match to the existing LSI processes, since it is a new material.

These days, with respect to an insulating film composed mainly of silicon, an attempt has been made to introduce fluorine into a silicon dioxide film to thereby lower a dielectric constant thereof, resulting in that there was obtained a fluorine-added silicon dioxide film having a dielectric constant of about 3.

With respect to an insulating film composed mainly of polymer, an amorphous carbon fluoride film which can be deposited by CVD has attracted an attention as a film having both a heat resistance and a low dielectric constant. An amorphous carbon fluoride film would have a dielectric constant of about 2 by introducing fluorine thereinto.

Thus, it is effective to introduce fluorine into the above-mentioned insulating films composed mainly of silicon and polymer in order to lower a dielectric constant thereof.

As mentioned above, an attempt has been made to use a fluorine-added insulating film such as a fluorine-added silicon oxide film (SiOF) and an amorphous carbon fluoride film, as an insulating film to be used for a multi-layer wiring structure. It is possible to control a dielectric constant of those fluorine-added insulating films by varying a content of fluorine therein. If a content of fluorine in the fluorine-added insulating films is increased, a dielectric constant of each of the films is lowered. It would be necessary to increase a content of fluorine in the films in order to lower a parasitic capacity among wiring layers.

When a fluorine-added silicon oxide film is formed by CVD, hydride of silicon such as silane ($SiH_4$) and fluoride of silicon are employed as a process gas. A content of fluorine in the film is controlled by varying a supply ratio of silicon hydride and silicon fluoride. When an amorphous carbon fluoride film is formed by CVD, hydride of carbon such as methane ($CH_4$) and fluoride of carbon such as carbon tetrafluoride ($CF_4$) are employed as a process gas. A content of fluorine in the film is controlled by varying a supply ratio of carbon hydride and carbon fluoride. Herein, the term "hydride" means all compounds containing no hydrogen molecules and atoms in the specification.

However, the above-mentioned processes in which hydride is employed as a part of a process gas is accompanied with problems as follows.

A problem in a fluorine-added silicon oxide film is pointed out by H. Miyajima et al, "Formation Mechanism of F-added $SiO_2$ Films using Plasma CVD", 1994 Dry Process Symposium, pp. 133–138. A fluorine-added silicon oxide film is deposited by CVD in which silane ($SiH_4$), silicon tetrafluoride ($CF_4$) and oxygen gases are used as process gases, with a volume ratio between silane and silicon tetrafluoride being varied to thereby control a content of fluorine in a resultant film. If fluorine were introduced into a film by tens of percents, a dielectric film of a resultant film would be lowered to about 3.5. However, the resultant film would have hygroscopic property at the same time, resulting in that moisture captured in the film reacts with fluorine to thereby cause hydrolysis of the resultant film. The hydrolysis in turn causes the film to peel off at an interface of the insulating film and a film making contact with the insulating film and composed of material different from that of the insulating film.

When an amorphous carbon fluoride film is fabricated, a dielectric constant thereof can be varied in the range of about 4 to about 2 by varying a mixture ratio of carbon fluoride gas and hydrocarbon gas. However, since hydrofluoric acid, which is a product of reaction, is also captured in a resultant film, hydrofluoric acid would be produced, if the resultant film is heated to about 100 degrees. It is possible to lower a dielectric constant of a resultant film by increasing a content of fluorine. However, if an aluminum film is formed on an amorphous carbon fluoride film highly containing fluorine, the aluminum film is often corrupted, and as a result, turned into black in color.

A problem of generation of hydrofluoric acid in a reaction product causes not only a problem that hydrofluoric acid is captured in a resultant film, but also a problem that hydrofluoric acid corrupts an underlying film composed of a material which is highly reactive with hydrofluoric acid, such as aluminum. As a result, a material of which an underlying film is composed is limited to specific materials which does not react with hydrofluoric acid, which narrows availability of a process for fabricating an insulating film.

As mentioned above, both of a fluorine-added silicon oxide film and an amorphous carbon fluoride film have problems considered to be caused by hydrofluoric acid which is produced as a reaction product when hydride is employed as a part of a process gas. In particular, such problems become remarkable, if a content of fluorine in a resultant film is increased for lowering a dielectric constant of the film.

In addition, there paused additional problems in association with an increase in a content of fluorine, as follows.

For instance, a problem associated with an amorphous carbon fluoride film is pointed out by K. Endo et al., "Fluorinated amorphous carbon thin film grown by plasma enhanced chemical vapor deposition for low dielectric constant interlayer dielectrics", Journal of Applied Physics, Vol. 78(2), 1995, pp. 1370–1372. If a content of fluorine in an amorphous carbon fluoride film is increased too much, there would be caused problems of degradation of a heat resistance, reduction in hardness, and reduction in adhesion with a film composed of a material different from that of the amorphous carbon fluoride film. In other words, an insulating property of an insulating film is degraded in annealing at a high temperature to be carried out after deposition of the film, a dielectric constant is increased, and an insulating film is peeled off in a polishing step for planarizing the film.

The same problems as mentioned above are paused also in a fluorine-added silicon oxide film. In addition, if a content of fluorine in the film were increased, the film would have an enhanced hygroscopic property, resulting in that the insulating film might be decomposed by moisture which the insulating film itself absorbs by virtue of the enhanced hygroscopic property.

In order to solve the above-mentioned problems, various attempts have been made. For instance, in order to enhance adhesion of an amorphous carbon fluoride film with other films, a content of fluorine at an interface at which the amorphous carbon fluoride film makes contact with another film or an underlying substrate is locally reduced. However, the above-mentioned problem caused by hydrofluoric acid, a product of reaction, cannot be completely solved by the method in which a content of fluorine in an insulating film is varied by varying a mixture ratio of a fluorine-family gas and a hydrogen-family gas. Hence, it is not possible to completely prevent hydrofluoric acid captured in an insulating film from degrading a dielectric strength and corroding metal or other insulating films with which the insulating film makes contact.

Japanese Unexamined Patent Publication No. 8-97199 has suggested a method of forming a fluorine-added insulating film. A fluorine-added insulating film is formed by plasma-enhanced CVD where an electric power having at least two radio-frequencies one of which is 30 MHz or greater. In accordance with the suggested method, the number of fluorine radicals and ions is increased, and those fluorine radicals and ions react with hydrogen and carbon existing in a plasma. A product produced by the reaction is discharged out of a plasma-enhanced CVD apparatus. As a result, hydrogen and carbon reach a substrate, and hence, a coefficient of moisture absorption of a resultant insulating film is prevented from increasing due to reaction with hydrogen and oxygen existing in atmosphere.

However, an insulating film formed by the above-mentioned method suggested by Japanese Unexamined Patent Publication No. 8-97199 is accompanied with the same problem as mentioned above. Namely, hydrofluoric acid still remains in an insulating film formed by the above-mentioned method, and hence, it is not possible to solve the problems caused by hydrofluoric acid.

SUMMARY OF THE INVENTION

It is an object of the present invention to provide a method of forming a fluorine-added insulating film without producing hydrofluoric acid as a reaction product.

There is provided a method of forming an insulating film containing fluorine therein, including the step of dissociating a process gas containing no hydrogen molecules and atoms with plasma in a reduced pressure.

There is further provided a method of forming an insulating film containing fluorine therein, including the steps of (a) dissociating a process gas containing no hydrogen molecules and atoms with plasma in a reduced pressure, and (b) varying the pressure while the insulating film is being formed, for controlling a content of fluorine in the insulating film.

For instance, the pressure may be varied by either varying a flow rate of the process gas into an apparatus in which the insulating film is formed, or varying an exhaust rate at which an exhaust gas is discharged out of an apparatus in which the insulating film is formed.

As an alternative, the pressure may be first set low, then raised, and then lowered in the step (b). By controlling the pressure in this way, it is possible to sandwich an insulating film containing fluorine at a high content between insulating films containing fluorine at a low content, resulting in remarkable enhancement in adhesion of the insulating film with other films composed of different material than that of the insulating film, and enhancement in a heat resistance of the insulating film.

For instance, the insulating film containing fluorine therein may be an amorphous carbon fluoride film, in which case, it is preferable that the pressure is at least temporarily equal to or smaller than 1 mTorr.

As an alternative, the insulating film containing fluorine therein may be a silicon dioxide film containing fluorine therein, in which case, it is preferable that the pressure is at least temporarily equal to or smaller than 5 mTorr. It is also preferable that the insulating film is formed so as to contain fluorine at 15% or smaller.

When the insulating film is formed as an amorphous carbon fluoride film containing fluorine therein, all materials stably, chemically existing in the nature, represented with CxFy wherein x and y are integers, may be used as a material containing no hydride. When the insulating film is formed as a fluorine-added silicon oxide film, a combination of all chemically stable materials represented with SixFy wherein x and y are integers, and an oxidizer such as oxygen, ozone and nitrogen monoxide.

As mentioned later, a plasma may be generated by using helicon waves. It is preferable to select a plasma source which provides high dissociation. A plasma source may be of electron-cyclotron resonant type, inductive coupling type, capacitive coupling type, or any other types.

In accordance with the above-mentioned method, since a fluorine-added insulating film is formed without adding hydride thereinto, there is not produced hydrofluoric acid as a reaction product. Hence, it is possible to avoid the problems caused by hydrofluoric acid as a reaction product, and as a result, it is possible to solve the problems caused when the insulating film is formed.

The problem not yet solved is that an enhancement in a hygroscopic property and a reduction in adhesion with different materials than that of the insulating film, both of which is caused by a content of fluorine increased for lowering a dielectric constant of an insulating film, which is an original purpose of adding fluorine into an insulating film. For instance, if an amorphous carbon fluoride film is formed only of carbon tetrafluoride ($CF_4$) without adding hydride thereinto, it would be difficult to control a content of fluorine in a resultant insulating film. In particular, it would be quite difficult to have an insulating film containing fluorine at a low content. This is because, even if carbon tetrafluoride ($CF_4$) is decomposed in plasma under an ordinarily selected pressure, that is, a reduced pressure such as tens of mTorr, reactive species to which a mass of fluorine atoms such as $CF_2$ and $CF_3$ is coupled are generated, and the thus generated reactive species are captured in an insulating film with the result that an insulating film containing fluorine at a low content cannot be obtained.

As mentioned earlier, a content of fluorine in an insulating film was attempted to locally lower at an interface at which the insulating film makes contact with other films or a substrate, in order to enhance adhesion of an amorphous carbon fluoride film. However, the local reduction in a content of fluorine is quite difficult or almost impossible for the above-mentioned reason.

It is a deposition in plasma in a reduced pressure equal to or smaller than a couple of mTorrs that is effective for controlling a fluorine content, in particular, for forming an insulating film containing fluorine at a low content, at an interface at which the insulating film makes contact with other films or a substrate. For instance, if a carbon tetrafluoride ($CF_4$) gas is plasma-dissociated in a pressure of 1 mTorr or smaller, a mass of low-order reactive species such as C and CF are produced, and as a result, it would be possible to deposit an insulating film containing fluorine therein at a low content. The reason why a plasma could provide higher dissociation at a lower pressure is that a temperature of electrons in a plasma becomes higher at a lower pressure, and hence, dissociation of radicals because of collision of electrons is facilitated.

When $SiF_4$ is plasma-dissociated, fluorine atoms are dissociated to a greater degree at a lower plasma-dissociation pressure. As a result, there are produced radicals, such as $SiF_3$, $SiF_2$ and SiF, which contain fluorine at a lower content than $SiF_4$. Since an insulating film is formed of those radicals containing fluorine at a lower content, it is possible to form an insulating film containing fluorine at a low content. Thus, it is possible to provide an insulating film capable of controlling a content of fluorine in an insulating film, and hence, a dielectric constant, adhesion, hygroscopic property and so on of an insulating film without adding hydride thereinto, and having a great dielectric constant and enhanced adhesion, but no hygroscopic property at an interface at which the insulating film makes contact with other films or a substrate.

How a content of fluorine in an insulating film can be detected by observing a variation in an index of refraction caused by addition of fluorine, or a variation in infrared absorption spectrum of the insulating film.

The above and other objects and advantageous features of the present invention will be made apparent from the following description made with reference to the accompanying drawings, in which like reference characters designate the same or similar parts throughout the drawings.

BRIEF DESCRIPTION OF THE DRAWINGS

FIG. 2 is a graph showing a relation between a pressure and a content of fluorine in an amorphous carbon fluoride film.

DESCRIPTION OF THE PREFERRED EMBODIMENTS

[First Embodiment]

In the first embodiment, an amorphous carbon fluoride film is formed employing only $C_4F_8$ gas as a process gas.

Figure 1:
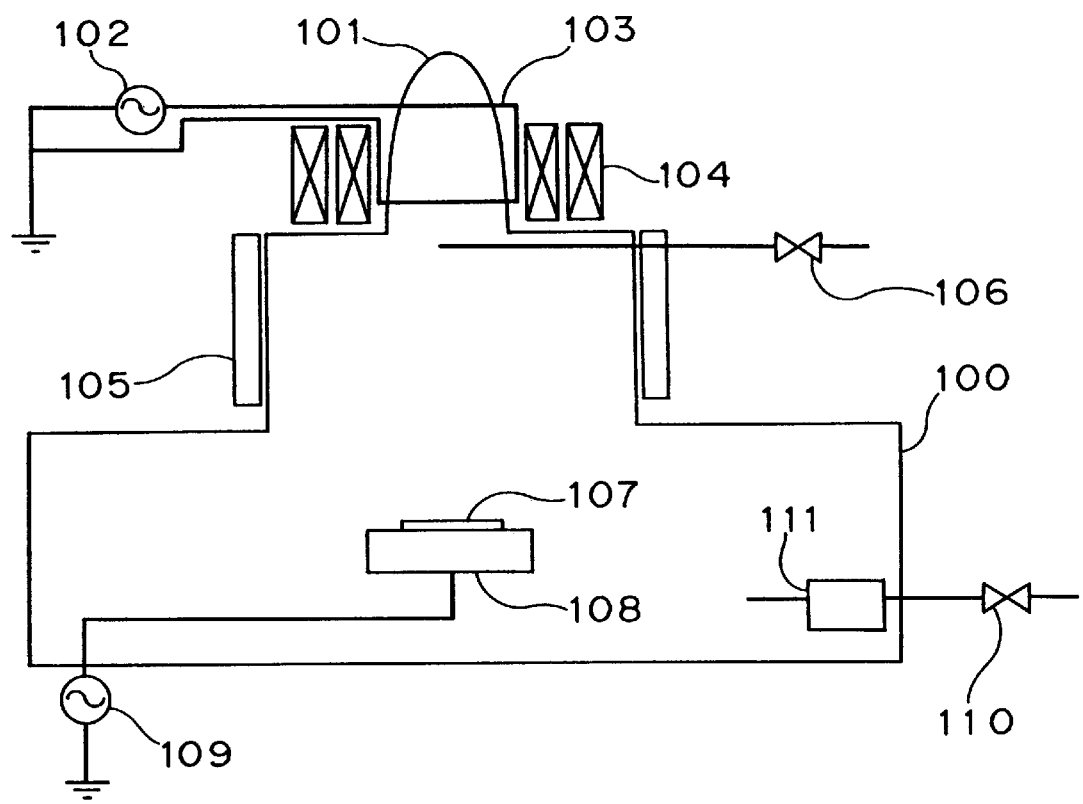
FIG. 1 is a schematic view illustrating an apparatus for carrying out helicon-wave plasma-excited chemical vapor deposition.

FIG. 1 illustrates a helicon-wave plasma-excited CVD apparatus used in the first embodiment. The illustrated apparatus includes a vacuum chamber 100, a bell-jar 101 composed of quartz and located in the vacuum chamber 100, an antenna 103 wound around the bell-jar 101, a radio-frequency electric power source 102 for applying radio-frequency to the antenna 103, a coil 104 situated around the bell-jar 101, and a ring-shaped permanent magnet 105 situated around the vacuum chamber 100.

The vacuum chamber 106 is formed with a gas inlet 106 through which a process gas is introduced into the vacuum chamber 100, and a gas outlet 110 through which an exhaust process gas is discharged out of the vacuum chamber 100. An orifice 111 is located in the vacuum chamber 100 upstream of the gas outlet 110 for controlling exhaust gas conductance. A support plate 108 is located in the vacuum chamber 100 just below the bell-jar 101. A bias high frequency source 109 applies bias high frequency to the support plate 108. A substrate 107 is placed on the support plate 108.

In the instant embodiment, the substrate 107 has a diameter of 6 inches. However, an insulating film may be formed on a substrate having a diameter up to 8 inches by means of the apparatus.

As mentioned later, a plasma source is preferable to provide high dissociation, and may be of electron cyclotron resonant type, inductive coupling type, or capacitive coupling type. How discharge is made does not matter. The helicon-wave excitation in the instant embodiment makes it possible to provide a highly densified plasma, and is characterized by that a plasma is stably produced even at a low vacuum, specifically, at a few millimeters vacuum or smaller.

First, since hydride is not added, there is not generated hydrofluoric acid. Accordingly, there is not paused the above-mentioned problems caused by generation of hydrofluoric acid.

A problem paused when an amorphous carbon fluoride film is formed only of $C_4F_8$ without adding hydride thereinto is that a content of fluorine in the film is difficult to control. As mentioned earlier, in particular when an amorphous carbon fluoride film is formed in a plasma under a pressure of tens of mTorr, there is paused a problem that only a film containing fluorine at a high content is obtained. However, as mentioned hereinbelow, the present invention makes it possible to control a content of fluorine in an insulating film by carrying out plasma-dissociation at a reduced pressure.

Hereinbelow is explained the experimental results showing how a content of fluorine in an amorphous carbon fluoride film varies when the film is formed in varied pressures. In the experiment, an insulating film was formed using $C_4F_8$ gas as a process gas by helicon-wave plasma-excited chemical vapor deposition. An exhaust rate of an exhaust gas discharged out of a vacuum chamber in which an amorphous carbon fluoride film was formed in a plasma was kept constant at 1000 liter per second in $N_2$ gas equivalent. A pressure at which an insulating film was formed was varied by varying a volume of a process gas supplied into the vacuum chamber.

FIG. 2 shows a relation between a pressure and a content ratio (F/C ratio) of carbon to fluorine in an amorphous carbon fluoride film having been formed when a flow rate of a process gas is varied from 5 sccm to 150 sccm to thereby vary a pressure from 0.5 mTorr to 15 mTorr. A temperature at which the amorphous carbon fluoride film was formed was set 100 degrees centigrade, and electric power for producing a plasma was set 2 kW.

When the pressure was 0.5 mTorr, the F/C ratio was about 0.53. This is considered because $C_4F_8$ gas is dissociated into radicals having a smaller molecular weight than $C_4F_8$, such as CF, C and $C_2$. When the pressure was relatively high, the F/C ratio was increased. This is considered because an amorphous carbon fluoride film was formed mainly of radicals having a greater molecular weight, such as CF and $CF_2$. Thus, it was discovered that a content of fluorine in a resultant film was varied, if a pressure at which the film was formed was varied.

Figure 3:
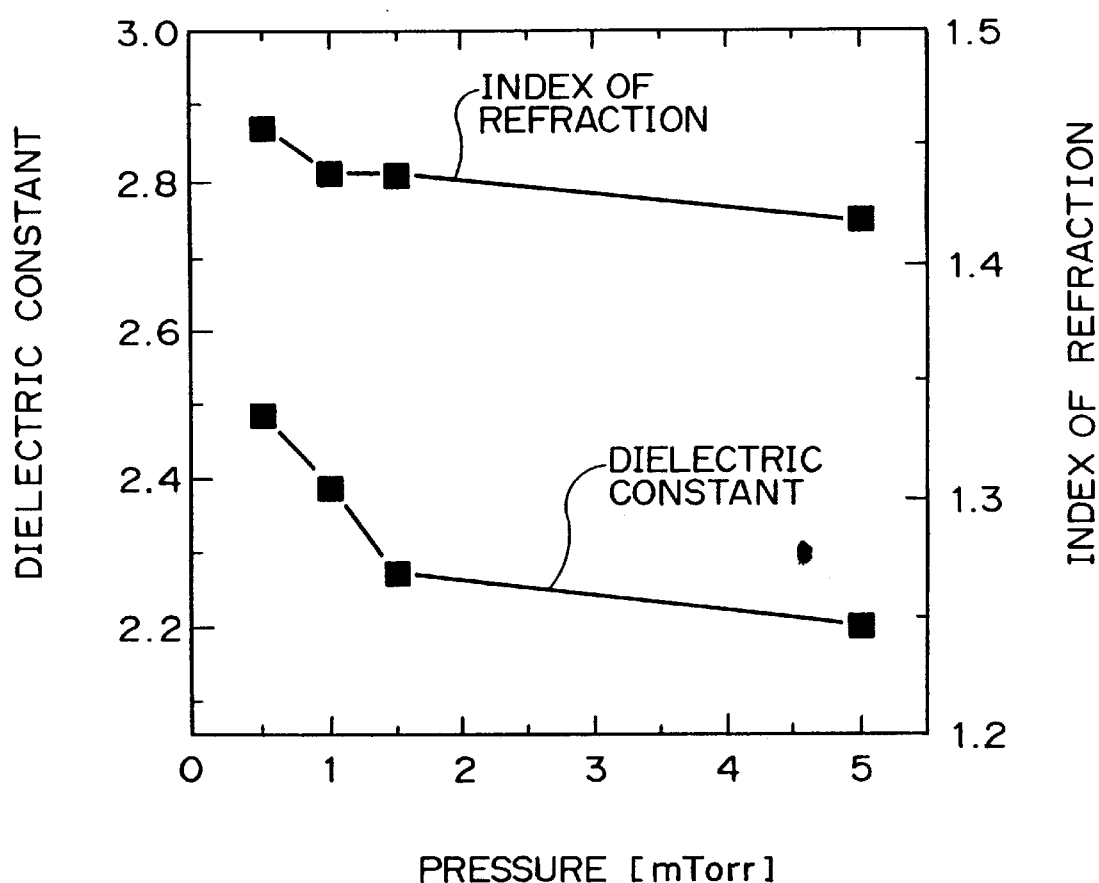
FIG. 3 is a graph showing a relation between a pressure and a dielectric constant, and a relation between a pressure and an index of refraction in an amorphous carbon fluoride film.

FIG. 3 is a graph similar to FIG. 2. FIG. 3 shows a relation between a pressure and a dielectric constant, and a relation between a pressure and an index of refraction in an amorphous carbon fluoride film with a pressure being varied by varying a flow rate of a process gas. As shown in FIG. 3, when a flow rate of a process was increased to thereby increase a pressure, there was obtained an amorphous carbon fluoride film having a quite small dielectric constant, specifically, a dielectric constant of about 2.2. This is a quite preferable characteristic for an interlayer insulating film.

On the other hand, when a flow rate of a process gas was decreased to thereby decrease a pressure, there was obtained an amorphous carbon fluoride film having a relatively great dielectric constant, specifically, a dielectric constant of about 2.5. However, a content of fluorine in such an amorphous carbon fluoride film was reduced, resulting in that the film had an enhanced adhesion with other materials. In particular, an amorphous carbon fluoride film formed at a pressure of 1 mTorr or smaller had a remarkably enhanced adhesion with other materials.

As mentioned earlier, a cause of variation in a content of fluorine in association with a variation in a pressure is radical species and a dependency of a concentration of the radical species on a pressure. A relative variation of radical species and a concentration thereof was observed employing plasma quantometric technique. As quantometric technique, there was selected actinometric technique suggested by L. D. B. Kiss, "CF and $CF_2$ actinometry in a $CF_4$/Ar plasma", Journal of Applied Physics, Vol. 71(7), 1992, pp. 3186–3192.

Figure 4:
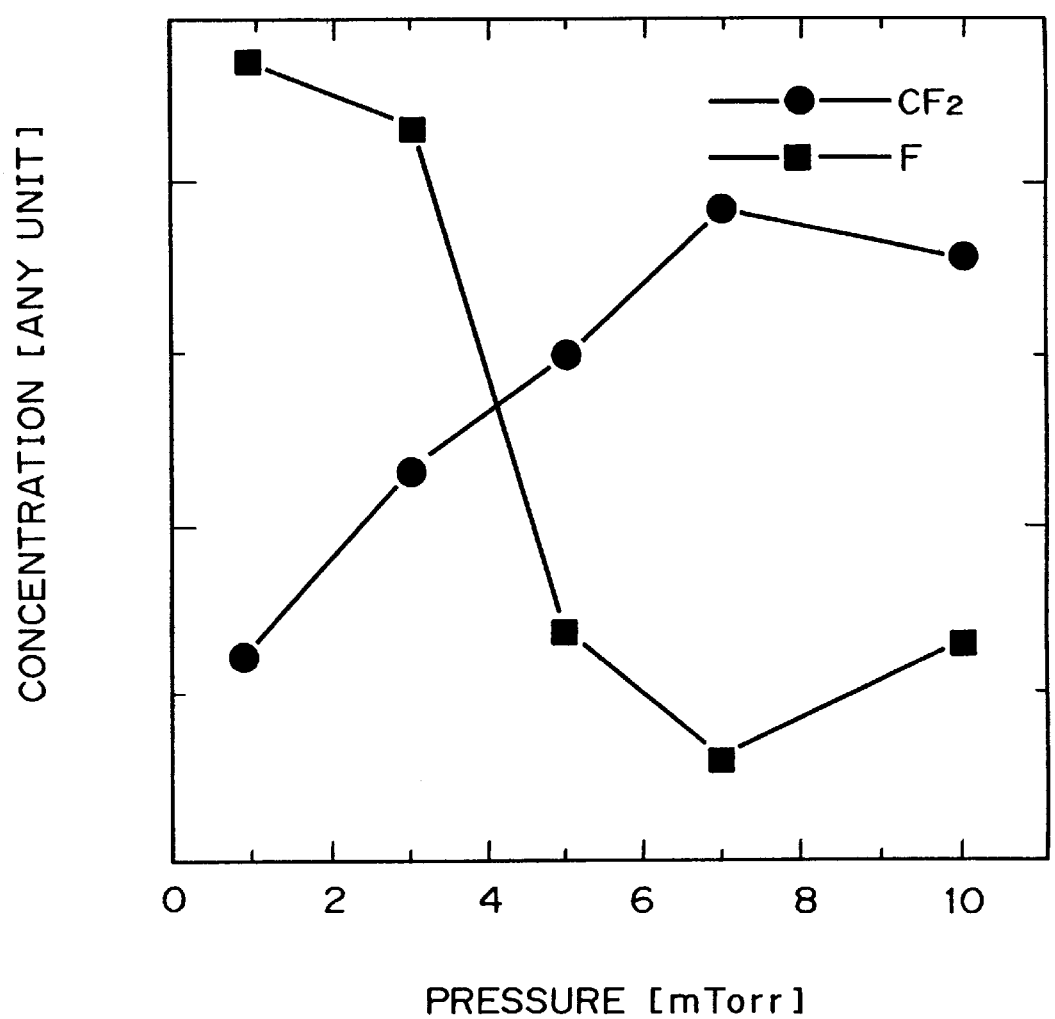
FIG. 4 is a graph showing a relation between a pressure and $CF_2$ and F radical concentrations in plasma.

FIG. 4 shows a dependency of $CF_2$ and CF on a pressure. $CF_2$ and CF were produced by plasma-dissociation of $C_4F_8$. In view of FIG. 4, it is understood that $CF_2$ was considerably decreased in concentration as a pressure was decreased, whereas an elemental atom F was increased in concentration. This indicates that species produced by plasma dissociation are turned into species having a lower molecular weight, at a low pressure, which implies that dissociation species which have a small molecular weight, even though coupled to C or F, are increased in number at a low pressure. If fluorine dissociated from carbon is considered to be discharged through a gas outlet without captured in an amorphous carbon fluoride film, it is rationally explained that a resultant amorphous carbon fluoride film would contain fluorine at a smaller amount, if it is formed at a lower pressure.

In the above-mentioned first embodiment, $C_4F_8$ is used as a process gas. However, it should be noted that a process gas is not to be limited to $C_4F_8$. For instance, the first embodiment may be applied to all of carbon fluoride gases which are represented with a general formula, CxFy, wherein x and y are integers, and which chemically stably exist in the nature. For instance, there may be employed $CF_4$, $C_2F_6$, $C_3F_8$, $C_2F_4$ and $C_6F_6$. If a process gas having a F/C ratio equal to or smaller than 2, there can be obtained an amorphous carbon fluoride film having a smaller content of fluorine than that of $C_4F_8$.

In the above-mentioned first embodiment, a pressure was varied with an exhaust rate of an exhaust gas being kept constant and a flow rate of a process gas being changed. The inventor conducted the experiment in which a pressure was varied with a flow rate of a process gas being kept constant and an exhaust rate being changed. It was also confirmed in the experiment that a content of fluorine and a dielectric constant could be controlled in dependence on a pressure.

As mentioned so far, it is possible to avoid generation of hydrofluoric acid in a reaction product by using a process gas containing no hydride. Furthermore, it is also possible to control a content of fluorine in a resultant insulating film by varying a pressure at which a plasma is generated, to thereby vary a dissociation degree of carbon fluoride gas.

[Second Embodiment]

In the second embodiment, a fluorine-added silicon oxide film is formed without adding hydride such as silane ($SiH_4$) thereinto.

The apparatus illustrated in FIG. 1 was also used for forming a fluorine-added silicon oxide film. Similarly to the formation of an amorphous carbon fluoride film, a plasma source is preferable to provide high dissociation, and may be of electron cyclotron resonant type, inductive coupling type, or capacitive coupling type. How discharge is made does not matter.

Similarly to the first embodiment, since a fluorine-added silicon oxide film is formed without adding hydride thereinto, there are not paused various problems associated with generation of hydrofluoric acid.

A problem paused when a fluorine-added silicon oxide film is formed, for instance, of $SiF_4$ and $O_2$ without adding hydride thereinto is that it is difficult to control a content of fluorine in the film. In particular, similarly to the formation of an amorphous carbon fluoride film, a problem remains unsolved that nothing but a fluorine-added silicon oxide film containing fluorine at a high content can be obtained, if a plasma is generated at a pressure of a few mTorrs. However, the present invention solves this problem. Namely, the present invention makes it possible to control a content of fluorine in a fluorine-added silicon oxide film by plasma-dissociation at a reduced pressure.

Hereinbelow is explained the experiment the inventor conducted to show the dependency of a dielectric constant of a fluorine-added silicon oxide film on a pressure at which the film is formed. In the experiment, $SiF_4$ and $_2$ were used as a process gas, and hydride such as silane ($SiH_4$) was not used.

The flow rates of $SiF_4$ and $O_2$ gases were kept constant, and an exhaust rate of an exhaust gas was kept constant at 1000 litter per second in $N_2$ equivalent. A pressure was varied by varying a total flow rate of the process gas supplied into a vacuum chamber. A temperature at which the fluorine-added silicon oxide film was formed was set 200 degrees centigrade, and electric power for producing a plasma was set 2 kW.

Figure 5:
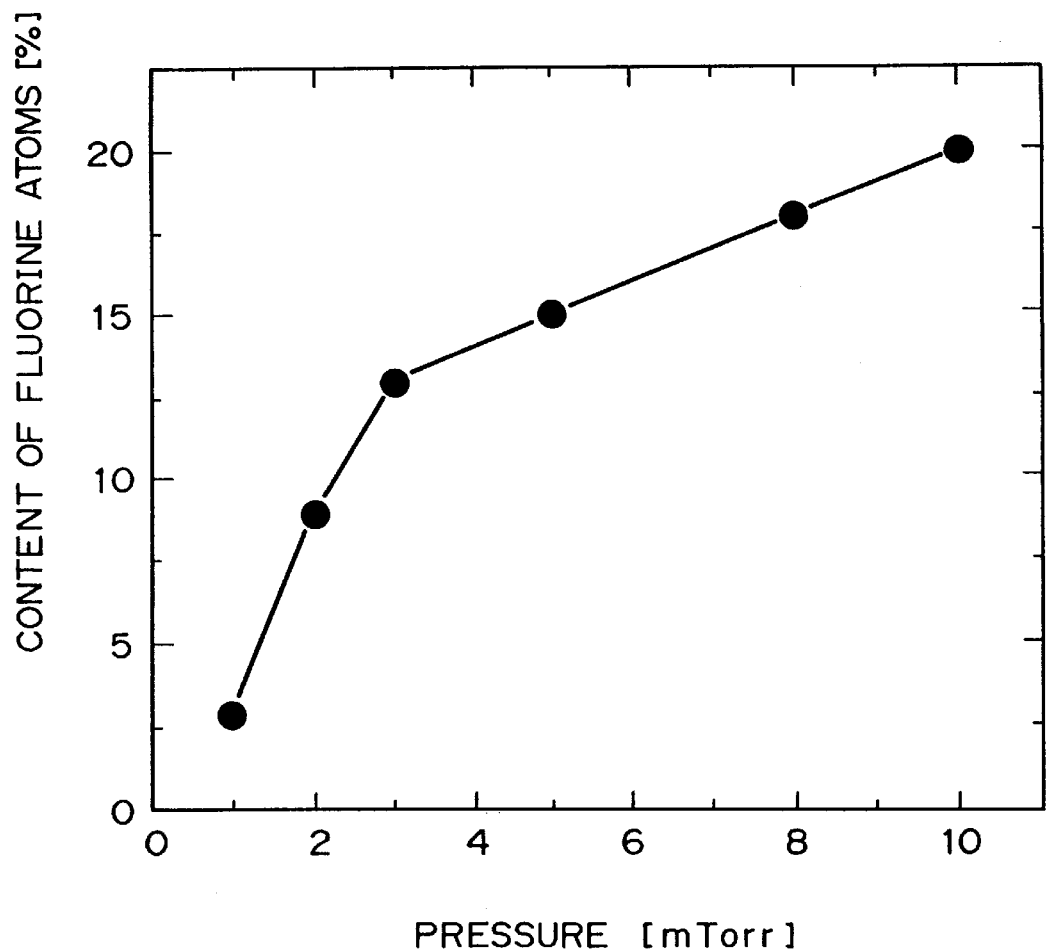
FIG. 5 is a graph showing a relation between a pressure and a content of fluorine in a fluorine-added silicon dioxide film.

FIG. 5 shows a relation between a pressure and a content of fluorine in a fluorine-added silicon oxide film having been formed when a total flow rate of the process gas was varied from 10 sccm to 100 sccm to thereby vary a pressure from 1 mTorr to 10 mTorr with a flow rate ratio between $SiF_4$ and $O_2$ gases being set 1:2. In view of FIG. 5, it was understood that a content of fluorine in a fluorine-added silicon oxide film was over 10% at a relatively high pressure, whereas the content could be reduced to a few percents at a relatively low pressure. In particular, the content was reduced to about 3% at a pressure of 1 mTorr. This is considered because $SiF_4$ gas is dissociated at a relatively low pressure into Si or SiF both having a lower molecular weight than $SiF_4$, similarly to the above-mentioned amorphous carbon fluoride.

Figure 6:
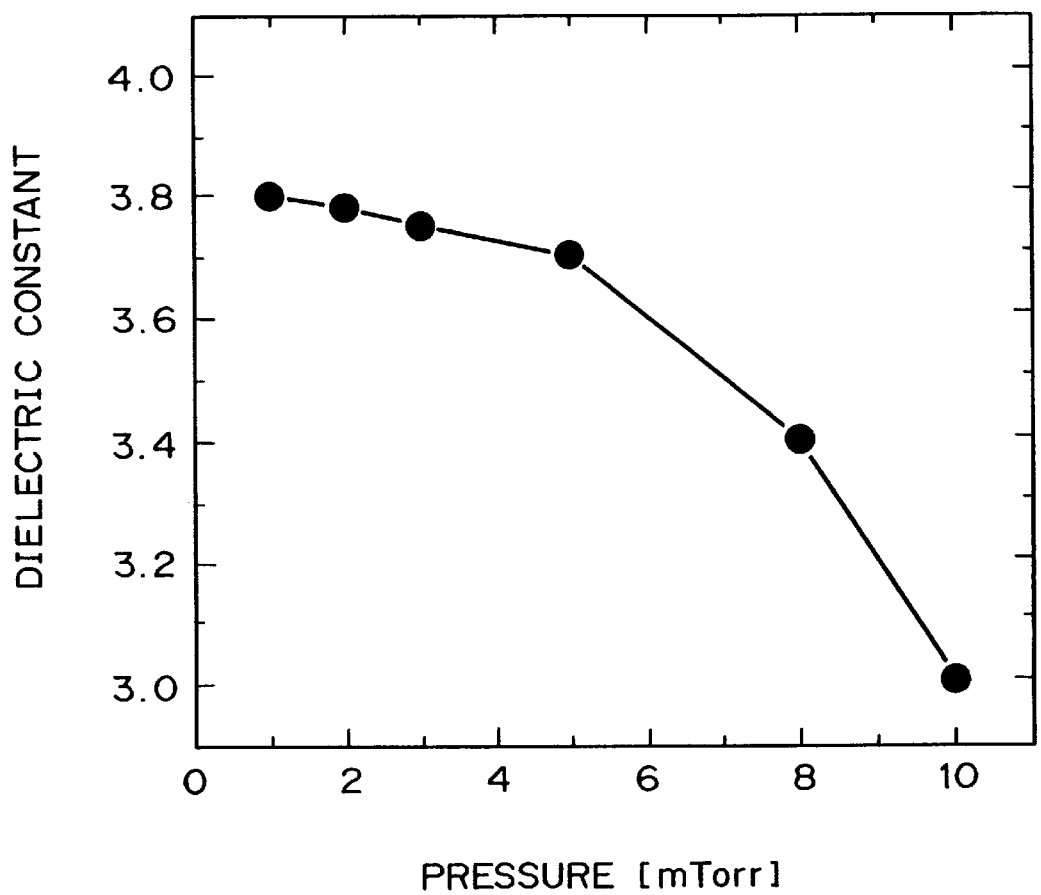
FIG. 6 is a graph showing a relation between a pressure and a dielectric constant in a fluorine-added silicon dioxide film.

FIG. 6 shows a relation between a pressure and a dielectric constant of a fluorine-added silicon oxide film. Similarly to the above-mentioned amorphous carbon fluoride film, a dielectric constant is relatively high at a relatively low pressure, and relatively low at a relatively low pressure. This means that there can be obtained a fluorine-added silicon oxide film having no problems such as hygroscopic property. As a pressure varies, a dielectric constant of a fluorine-added silicon oxide film varies in the range of 3.8 to 3. This range is almost the same as that of silicon dioxide.

Then, a fluorine-added silicon oxide film was formed by varying an exhaust rate of an exhaust gas to thereby vary a pressure with a flow rate of a process gas being kept constant. Similarly to the above-mentioned case where a pressure was controlled by varying a total flow rate of a process gas, a process gas was dissociated to a greater degree at a higher exhaust rate, namely, at a lower pressure. Thus, it was possible to control a content of fluorine in the film and a dielectric constant of the film, similarly to the amorphous carbon fluoride film.

As mentioned so far, when a fluorine-added silicon oxide film was to be formed, a dissociation degree of $SiF_4$ gas varied by varying a pressure, resulting in that both a content of fluorine in the film and a dielectric constant of the film could be varied.

In the above-mentioned second embodiment, $SiF_4$ gas is used as a process gas. However, it should be noted that a process gas is not to be limited to $SiF_4$ gas. The second embodiment may be applied to all gases having no hydrogen, such as silicon fluoride gases which are represented with a general formula, SixFy, wherein x and y are integers, and which chemically stably exist in the nature.

[Third Embodiment]

As explained in the above-mentioned first and second embodiments, it was confirmed that a content of fluorine in both an amorphous carbon fluoride film and a fluorine-added silicon oxide film can be controlled by varying a pressure at which the film is to be formed, even if hydride is not added thereinto. Hence, in the third embodiment, an insulating film to be used for a multi-layered wiring structure in LSI is formed in accordance with the processes having been explained in the first and second embodiments.

In a first example described hereinbelow, adhesion of an amorphous carbon fluoride film with an underlying film is enhanced by controlling a content of fluorine in the film. As an underlying film, there was used a 200 nm-thick silicon oxide film which was formed on a silicon wafer by plasma-enhanced CVD using $SiH_4$ and $O_2$ gases as a process gas. The thus formed silicon oxide film is silicon-richer at a surface at which the film makes contact with an amorphous carbon fluoride film, than an ordinary silicon dioxide film, as suggested in Japanese Patent Application 8-321694 (not published yet) filed by the inventor, which is hereby incorporated by reference to extent that it is consistent herewith.

An amorphous carbon fluoride film was formed on the thus formed silicon oxide film as follows.

First, an amorphous carbon fluoride film was formed on the silicon oxide film in helicon-wave plasma in the following conditions.

Process gas: $C_4F_8$ gas

Flow rate: 150 sccm

Pressure: 15 mTorr

Electric Power: 2 kW

F/C ratio: 0.74

Substrate temperature: 100 degrees centigrade

Thickness: 300 nm

The thus formed film was peeled off immediately after the film has been formed.

Secondly, an amorphous carbon fluoride film was formed on the silicon oxide film in the following conditions.

Process gas: $C_4F_8$ gas

Flow rate: 5 sccm

Pressure: 0.5 mTorr

F/C ratio: 0.53

Thickness: about 30 nm

Then, after the pressure was raised to 15 mTorr, an amorphous carbon fluoride film having a F/C ratio of 0.74 was successively deposited on the previously formed amorphous carbon fluoride film. The thus formed amorphous carbon fluoride film was not peeled off.

It is a known technique to vary a content of fluorine in a depth-wise direction of a film in order to prevent the film from peeling off, as suggested in Japanese Unexamined Patent Publication No. 8-83842 filed by the inventor, which is hereby incorporated by reference to extent that it is consistent herewith. However, in accordance with the present invention, a content of fluorine can be varied in a depth-wise direction of an amorphous carbon fluoride film merely by varying a pressure when the film is formed, without adding hydride into the film.

For comparison, an amorphous carbon fluoride film was formed on a silicon dioxide film in accordance with a conventional process, namely, in the following conditions.

Process gas: $C_4F_8$ gas

Flow rate of $C_4F_8$: 50 sccm

Added gas: $CH_4$, gas

Flow rate of $CH_4$: 50 sccm

Pressure: 10 mTorr

F/C ratio: 0.5

The thus formed amorphous carbon fluoride film was not peeled off. However, it was confirmed that if hydride is added into an amorphous carbon fluoride film formed in accordance with a conventional process, hydrofluoric acid is desorbed into a gas phase from the film when heated to 100 degrees centigrade or higher.

In the amorphous carbon fluoride film formed at any pressure in accordance with the instant embodiment, hydrofluoric acid was not observed to desorb from the film.

In an amorphous carbon fluoride film formed by adding hydride thereinto, after annealed at 100 degrees centigrade, it was observed that the underlying silicon oxide film was corroded. In particular, when an aluminum wiring layer appeared in an underlying layer, aluminum was remarkably corroded.

To the contrary, an amorphous carbon fluoride film formed only of fluoride in accordance with the instant embodiment was not corroded at all.

In place of the above-mentioned amorphous carbon fluoride film, there may be employed an amorphous carbon fluoride film formed only from $CH_4$ and containing no fluorine. However, such an amorphous carbon fluoride film has a dielectric constant of 3 or greater. To the contrary, in accordance with the present invention, it is possible to form an amorphous carbon fluoride film having a dielectric constant of 3 or smaller, which is suitable as an interlayer insulating film.

An amorphous carbon fluoride film may be formed as follows. An amorphous carbon fluoride film containing fluorine at a low content at a low pressure is first formed, and then a pressure is raised. Then, an amorphous carbon fluoride film having a low dielectric constant and containing fluorine at a high content is deposited on the previously formed film. Then, the pressure is reduced to an initial pressure set when a discharge was started. Thereafter, an amorphous carbon fluoride film containing fluorine at a low content is deposited again by a thickness of about 30 nm. By forming an amorphous carbon fluoride film in the above-mentioned manner, an adhesion of the resultant film with other films which are composed of different materials than the film, such as an amorphous carbon film, a silicon oxide film, and a titanium nitride film, is enhanced.

The inventor conducted a peeling experiment for evaluating adhesion of an amorphous carbon fluoride film formed in accordance with the present invention. The peeling experiment was conducted as follows. First, an amorphous carbon fluoride film having a thickness of 0.5 micron was formed on another film composed of different material than that of the amorphous carbon fluoride film. Then, the amorphous carbon fluoride film was patterned into a pattern where 1 mm×1 mm islands were formed in a grid. Then, an adhesive tape was adhered onto the amorphous carbon fluoride film, and peeled off. This experiment was repeated to 100 test pieces. An adhesion of the amorphous carbon fluoride film was evaluated based on a ratio of the number of the test pieces where the amorphous carbon fluoride film was not peeled off to the number of the test pieces where the amorphous carbon fluoride film was peeled.

The result was that an amorphous carbon fluoride film formed at a pressure of 1.5 mTorr had an adhesion of about 50%, whereas an amorphous carbon fluoride film formed at a pressure of 1 mTorr or smaller had an adhesion of 100%. That is, if an amorphous carbon fluoride film making contact with other films composed of different materials than the amorphous carbon fluoride film, such as a silicon oxide film, a titanium nitride film, and an aluminum film, were formed at a pressure of 1 mTorr or smaller, it is possible to obtain an amorphous carbon fluoride film which would not be peeled off an underlying layer.

In the next case, a silicon dioxide film was deposited on an amorphous carbon fluoride film formed on an underlying layer, and in addition, the silicon dioxide film was chemically and mechanically polished. The silicon dioxide film formed on the amorphous carbon fluoride film had a silicon-richer interface at which the silicon dioxide film made contact with the amorphous carbon fluoride film, similarly to the underlying layer. The amorphous carbon fluoride film had a three-layers structure at an interface at which the amorphous carbon fluoride film made contact with the underlying layer. The three-layers structure was comprised of a first film formed at a pressure of 0.5 mTorr and having a thickness of about 30 nm, and containing fluorine at a low content, a second film formed on the first film at a pressure of 15 mTorr and having a thickness of 300 nm and a dielectric constant lower than that of the first film, and containing fluorine at a high content, and a third film formed on the second film by a thickness of 30 nm in the same conditions as the first film, and containing fluorine at a low content.

On the amorphous carbon fluoride film having the above-mentioned three-layers structure was formed a silicon dioxide film by plasma-enhanced CVD by a thickness of 2 micron. Then, the silicon dioxide film was chemically and mechanically polished with silica slurry for planarization. Thereafter, an adhesion of the amorphous carbon fluoride film was evaluated.

The silicon dioxide film was chemically and mechanically polished at a polishing pressure of 7 psi to thereby polish about 1 micron. The amorphous carbon fluoride film having the three-layers structure was not observed to peel off. However, the amorphous carbon fluoride film having no film containing a fluorine at a low content or the amorphous carbon fluoride film having a film containing fluorine at a low content, but formed at a pressure over 1 mTorr was observed to peel off at an interface at which the amorphous carbon fluoride film makes contact with an underlying layer or a layer formed thereon.

Thus, it was understood that if an amorphous carbon fluoride film was subject to a step of receiving a mechanical pressure such as chemical and mechanical polishing, the amorphous carbon fluoride film was necessary to be formed at a pressure equal to or smaller than 1 mTorr, and have an adhesion layer containing fluorine at a low content. If it is not necessary to lower a dielectric constant of an interlayer insulating film below 2.5, an amorphous carbon fluoride film may be formed at a pressure equal to or smaller than 1 mTorr.

Hereinbelow is described a SiOF film in the third embodiment. A SiOF film was formed on a silicon oxide film in the following conditions.

Process gas: $SiF_4$ and $O_2$ gases
Substrate temperature: 200° C.
Electric power: 2 kW
Pressure: 10 mTorr
Fluorine content: 20%
Thickness: 300 nm However, the SiOF film was peeled off immediately after the SiOF film was formed. In addition, the SiOF film showed hygroscopic property.

Hence, a SiOF film containing fluorine at 3% was first formed at a pressure of 1 mTorr by a thickness of about 30 nm, then a pressure was varied to 10 mTorr without stopping discharging, and a SiOF film containing fluorine at 20% was successively deposited on the previously formed SiOF film. By forming a SiOF film in such a manner, the SiOF film was prevented from peeling off.

In addition, hygroscopic property of a SiOF film could be improved by changing a pressure to 1 mTorr, and depositing a cap layer at a fluorine content of 3% by a thickness of 30 nm. Furthermore, the formation of the cap layer enhances an adhesion of the SiOF film at an interface between the SiOF film itself and other films formed thereon and composed of different materials than the SiOF film, such as a silicon oxide film, an aluminum film, and a titanium nitride film.

The above-mentioned cap layer containing fluorine at 3% was formed by a thickness of about 300 nm, and the inventor conducted an experiment about peeling-off of the film with other films composed of different materials than the cap film. An experiment about hygroscopic property of the cap film was also conducted by dipping the cap film into water. The results were that the cap film showed the same characteristics as those of a silicon oxide film containing no fluorine. However, if the cap layer containing fluorine at 3% was replaced with a silicon oxide film containing no fluorine, there was paused a problem about an adhesion of the SiOF film at an interface between the SiOF film and a fluorine-added silicon oxide film containing fluorine at 20%.

It was confirmed that a fluorine-added silicon oxide film is necessary to be formed at a pressure of 5 mTorr or smaller at a fluorine content of 15% or smaller in order to improve an adhesion and hygroscopic property thereof. Infra red absorption spectroscopic analysis was conducted. The result was that if a SiOF film was formed at a pressure of 5 mTorr or greater, $SiF_2$ couplings exist in the SiOF film, whereas if a SiOF film was formed at a pressure of 5 mTorr or smaller, only SiF couplings were observed to exist in the SiOF film, and $SiF_2$ couplings were not observed in the SiOF film. In light of this fact, the hygroscopic property of the SiOF film is considered to be derived from $SiF_2$ couplings. In addition, this fact supports a conception that if a SiOF film is formed at a pressure of 5 mTorr or smaller, film formation species in plasma was changed from $SiF_2$ to SiF and other compounds or elements having a lower molecular weight.

In the above-mentioned embodiments, both an amorphous carbon fluoride film and a fluorine-added silicon oxide film are designed to have the three-layers structure having a fluorine-added insulating film having a high content of fluorine and sandwiched between fluorine-added insulating films each having a low content. However, a multi-layers structure of the both films is not to be limited to a three-layers structure.

For instance, when an insulating film having so-called damacine structure is formed with a groove, and a wiring metal is filled in the groove, the groove has to be formed by etching by a certain depth in a depth-wise direction thereof In this arrangement, it is preferable for an insulating film to have a five-layers structure including two fluorine-added insulating films each having a low content of fluorine, and each being sandwiched between fluorine-added insulating films each having a high content of fluorine. When the insulating film is formed with a groove by etching, an etching rate is considerably reduced in a fluorine-added insulating film having a low content of fluorine, located at the center of the five-layer structure in a thickness-wise direction thereof, resulting in that it is possible to controlably form a groove having a desired depth.

In the above-mentioned embodiments, a fluorine-added silicon oxide film and an amorphous carbon fluoride film are selected as an example. However, those embodiments show that it is possible to control a content of fluorine in an insulating film by controlling a dissociation degree of plasma with a pressure at which the insulating film is formed, and hence, materials of which an insulating film is composed are not to be limited to those. As an insulating film, there may be selected a fluorine-added silicon nitride film to be formed using $SiF_4$ and $N_2$ or $NF_3$ gases as a process gas, a fluorine-added boron nitride film to be formed by plasma-enhanced CVD, employing $N_2$, $NF_3$ or $BF_3$, and a fluorine-added boron silicide film to be formed employing $N_2$, $NF_3$ or $BF_3$ and $SiF_4$. It is preferable that an insulating layer containing fluorine at a low content is formed by plasma at a reduced pressure at least in the vicinity of an interface between a fluorine-added insulating film having a low dielectric constant and another film composed of different material than the fluorine-added insulating film. By doing so, an adhesion of the fluorine-added insulating film at the interface can be remarkably enhanced, and reaction at the interface can be prevented, resulting in a stable multi-layered structure.

In addition, if a film formation pressure is varied while a fluorine-added insulating film is being formed, it would be possible to form an insulating film having a multi-layered structure containing fluorine at any content. Hence, a multi-layered structure can be formed in accordance with a use of an insulating film.

As having been explained in connection with the preferred embodiment, in accordance with the present invention, it is possible to form a fluorine-added insulating film in which hydrofluoric acid, a product causing many problems, is not generated, by using materials containing no hydride therein. In addition, a control for a content of fluorine in an insulating film, which was difficult because the insulating film contains no hydride, is accomplished by varying a pressure while the insulating film is being formed. In particular, a fluorine-added insulating film having a low content of fluorine, which, if inserted between other films composed of different materials than that of the fluorine-added insulating film, enhances stability at interfaces therebetween, can be deposited by plasma-dissociation at a low pressure.

As a result, since quite a low dielectric constant can be accomplished, it is possible to solve various problems associated with a fluorine-added insulating film which has attracted an attention as an insulating film for LSI, such as an adhesion at an interface between the fluorine-added insulating film and other films composed of different materials than that of the fluorine-added insulating film, reactivity at the interface, and hygroscopic property of the fluorine-added insulating film.

In addition, the present invention provides a fluorine-added insulating film which can withstand LSI fabrication steps such as chemical and mechanical polishing (CMP).

While the present invention has been described in connection with certain preferred embodiments, it is to be understood that the subject matter encompassed by way of the present invention is not to be limited to those specific embodiments. On the contrary, it is intended for the subject matter of the invention to include all alternatives, modifications and equivalents as can be included within the spirit and scope of the following claims.

The entire disclosure of Japanese Patent Application No. 9-144878 filed on Jun. 3, 1997 including specification, claims, drawings and summary is incorporated herein by reference in its entirety.

What is claimed is:

1. A method of forming an insulating film containing fluorine therein, comprising dissociating a process gas containing no hydrogen molecules and atom with plasma in a reduced pressure wherein said insulating film containing fluorine therein is an amorphous carbon fluoride film.

2. The method as set forth in claim 1, wherein said pressure is at least temporarily equal to or smaller than 1 mTorr.

3. A method of forming an insulating film containing fluorine therein, comprising dissociating a process gas containing no hydrogen molecules and atom with plasma in a reduced pressure wherein said insulating film containing fluorine therein is composed of CxFy wherein x and y are integers.

4. A method of forming an insulating film containing fluorine therein, comprising dissociating a process gas containing no hydrogen molecules and atom with plasma in a reduced pressure wherein said pressure is at least temporarily equal to or smaller than 5 mTorr.

5. The method as set forth in claim 4, wherein said insulating film containing fluorine therein is a silicon dioxide film containing fluorine therein.

6. The method as set forth in claim 4, wherein said insulating film is formed so as to contain fluorine at 15% or smaller.

7. The method as set forth in claim 4, wherein said insulating film containing fluorine therein is composed of SixFy wherein x and y are integers.

8. A method of forming an insulating film containing fluorine therein comprising:
   (a) dissociating a process gas containing no hydrogen molecules and atoms, with plasma in a reduced pressure; and
   (b) varying said pressure while said insulating film is being formed, for controlling a content of fluorine in said insulating film wherein said pressure is varied by varying a flow rate of said process gas into an apparatus in which said insulating film is formed.

9. The method as set forth in claim 8, wherein said insulating film containing fluorine therein is composed of SixFy wherein x and y are integers.

10. A method of forming an insulating film containing fluorine therein comprising:
    (a) dissociating a process gas containing no hydrogen molecules and atoms, with plasma in a reduced pressure; and
    (b) varying said pressure while said insulating film is being formed, for controlling a content of fluorine in said insulating film wherein said pressure is varied by varying an exhaust rate at which an exhaust gas is discharged out of an apparatus in which said insulating film is formed.

11. A method of forming an insulating film containing fluorine therein comprising:
    (a) dissociating a process gas containing no hydrogen molecules and atoms, with plasma in a reduced pressure; and
    (b) varying said pressure while said insulating film is being formed, for controlling a content of fluorine in said insulating film wherein said pressure is first set low, then raised, and then lowered in said step (b).

12. A method of forming an insulating film containing fluorine therein comprising:
    (a) dissociating a process gas containing no hydrogen molecules and atoms, with plasma in a reduced pressure; and
    (b) varying said pressure while said insulating film is being formed, for controlling a content of fluorine in said insulating film wherein said insulating film containing fluorine therein is an amorphous carbon fluoride film.

13. The method as set forth in claim 12, wherein said pressure is at least temporarily equal to or smaller than 1 mTorr.

14. A method of forming an insulating film containing fluorine therein comprising:
    (a) dissociating a process gas containing no hydrogen molecules and atoms, with plasma in a reduced pressure; and
    (b) varying said pressure while said insulating film is being formed, for controlling a content of fluorine in said insulating film wherein said insulating film containing fluorine therein is composed of CxFy wherein x and y are integers.

15. A method of forming an insulating film containing fluorine therein comprising:
    (a) dissociating a process gas containing no hydrogen molecules and atoms, with plasma in a reduced pressure; and
    (b) varying said pressure while said insulating film is being formed, for controlling a content of fluorine in said insulating film wherein said pressure is at least temporarily equal to or smaller than 5 mTorr.

16. The method as set forth in claim 15, wherein said insulating film containing fluorine therein is a silicon dioxide film containing fluorine therein.

17. The method as set forth in claim 15, wherein said insulating film is formed so as to contain fluorine at 15% or smaller.

* * * * *